United States Patent
Konishi et al.

(10) Patent No.: US 6,800,546 B2
(45) Date of Patent: Oct. 5, 2004

(54) FILM FORMING METHOD BY RADIATING A PLASMA ON A SURFACE OF A LOW DIELECTRIC CONSTANT FILM

(75) Inventors: Nobuo Konishi, Nirasaki (JP); Mitsuaki Iwashita, Nirasaki (JP); Hiroki Ohno, Nirasaki (JP); Shigeru Kawamura, Nirasaki (JP); Masahito Sugiura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/095,025

(22) Filed: Mar. 12, 2002

(65) Prior Publication Data

US 2002/0177298 A1 Nov. 28, 2002

(30) Foreign Application Priority Data

Mar. 13, 2001 (JP) .......................................... 2001-70947

(51) Int. Cl.[7] .......................................... H01L 21/4763
(52) U.S. Cl. ...................... 438/623; 438/633; 438/634; 438/691; 438/788
(58) Field of Search ................................. 438/622–624, 438/633, 788–790

(56) References Cited

U.S. PATENT DOCUMENTS

| 5,651,867 | A | * | 7/1997 | Kokaku et al. | ......... | 204/298.25 |
| 6,008,540 | A | * | 12/1999 | Lu et al. | ...................... | 257/758 |
| 6,351,039 | B1 | * | 2/2002 | Jin et al. | ...................... | 257/759 |

* cited by examiner

Primary Examiner—Thanh Nguyen
(74) Attorney, Agent, or Firm—Rader, Fishman & Grauer PLLC

(57) ABSTRACT

The present invention comprises the steps of performing a reforming process on a surface of a low dielectric constant insulation film formed on a substrate which includes one of a porous low dielectric constant insulation film and a non-porous low dielectric constant insulation film and forming an insulation film as at least one of an etching mask and a Chemical Mechanical Polishing stopper (CMP stopper) on the reformed surface of the low dielectric constant insulation film. For example, plasma is radiated as a reforming process mentioned above, the surface roughness of a low dielectric insulation film is increased and, as a result, adhesion between the films and also between the inter-layer insulation film and other neighboring films can be improved with so-called "anchor effect".

9 Claims, 15 Drawing Sheets

| | Ra (Å) | Fluorine Density (atomic%) |
|---|---|---|
| No Plasma Processing | 1.387 | 5.6 |
| Radiating Ar Plasma for 20 seconds | 1.037 | 2.4 |
| Radiating Ar Plasma for 40 seconds | 0.989 | 2.1 |

FIG.9

| | Ra (Å) |
|---|---|
| No Plasma Processing | 3.214 |
| Radiating Ar Plasma for 20 seconds | 4.840 |
| Radiating Ar Plasma for 40 seconds | 10.69 |

FIG.10

FILM FORMING METHOD BY RADIATING A PLASMA ON A SURFACE OF A LOW DIELECTRIC CONSTANT FILM

BACKGROUND OF THE INVENTION

1. Field of the Invention

The present invention relates to a film forming method and a film forming apparatus that forms an inter-layer insulation film and the like onto a semiconductor wafer in the semiconductor manufacturing steps.

2. Description of the Related Art

In a manufacturing step in a process of a semiconductor device, for example, SOD (Spin on Dielectric) system is used for forming an inter-layer insulation film. In the SOD system; a coating film is spin-coated on a wafer and an inter-layer insulation film is formed with performing processes like a chemical process or a heating process on the wafer.

For example, in a case of forming an inter-layer insulation film with sol-gel method, first of all, a solution in which an insulation film material is dispersed and dissolved into an organic solvent is supplied on a semiconductor wafer (hereinafter referred to as a "wafer"). Next a gelling process is performed on the wafer on which the solution is supplied by, for example, performing the heating process and the like.

Incidentally, manufacturing process of a semiconductor having a multi-level interconnection structure of recent years, a silicon oxide (SiO2) has commonly been used as a material for inter-layer insulation film and aluminum (Al) and the like has commonly been used as a material for wiring.

However, use of a copper (Cu) as a highly conductive wiring material for reduction of power consumed and use of, for example, an organic type insulation film ($C_mH_n$ type), an inorganic film, an inorganic film on which hydrophobic process is performed, and a fluorine doped silicon oxide film (SiOF film) and the like has become increasingly popular for the purpose of realizing low dielectric constant.

In this case, an inorganic type silicon nitride (SiN) film is formed on a Cu film in order to prevent diffusion of Cu, and inter-layer insulation film such as aforesaid organic film, the inorganic film, the inorganic film on which hydrophobic process is performed, and a SiOF film are formed thereon.

However, there is a problem that adhesion of a low dielectric constant insulation film and an insulation film as an etching mask and a Chemical Mechanical Polishing stopper (CMP stopper) is poor and the low dielectric constant insulation film peels off when the Chemical Mechanical Polishing process (CMP process) is performed. In addition, the problem is not only the poor adhesiveness of an inorganic type film and an organic type film but also the poor adhesiveness of an organic type film and a resist film of the same organic type is also a problem in the process of forming an inter-layer insulation film.

Thus recently, a method of forming an adhesive layer of Silicon Oxide type (SiO type) between the films, and improving adhesion with utilizing chemical bonding strength is applied. However, since the adhesive layer in the method of using chemical bonding strength is very thin, bonding strength is not so strong, therefore, adhesive strength can not be improved greatly. In addition, when the adhesive layer is made thicker in order to increase chemical bonding strength, there is a drawback that the dielectric constant will become high. Thus it is not appropriate to make such adhesive layer with high dielectric constant thick from the point of view of inter-layer insulation film manufacturing process of producing multi-layer films of the present day.

SUMMARY OF THE INVENTION

Considering the above-described circumstances, an object of the present invention is to provide a film forming method and a film forming apparatus that improves an adhesion between low-dielectric inter-layer insulation films and the like and adhesion between an inter-layer insulation film and other neighboring films.

In order to accomplish the above-described objects, a first aspect of a film forming method of the present invention comprising the steps of performing a reforming process on a surface of a low dielectric constant insulation film formed on a substrate which includes one of a porous low dielectric constant insulation film and a non-porous low dielectric constant insulation film and forming an insulation film as at least one of an etching mask and a Chemical Mechanical Polishing stopper on the reformed surface of the low dielectric constant insulation film In the present invention, for example, when plasma is radiated in order to perform a reforming process on a low dielectric constant insulation film such as an organic film, an inorganic film, an inorganic film on which a hydrophobic process is performed and a fluorine doped silicon film (SiOF film), a surface roughness of the organic film, the inorganic film, the inorganic film on which the hydrophobic process is performed increases and an adhesion with an insulation film formed as an upper layer of these films is improved by so-called an "anchor effect". In addition, as for the SiOF film, a density of fluorine on a surface thereof can be decreased, so that the adhesion with a low dielectric constant insulation film of organic type is formed as an upper layer.

On the other hand, surface roughness of a film is increased when, for example, an ultrasonic vibration is provided thereon as a reforming processing, and adhesion with an insulation film formed as the upper layer of the low dielectric constant insulation film is improved by so-called the "anchor effect".

A second aspect of the present invention is a film forming method comprising the steps of radiating plasma on a low dielectric constant insulation film and radiating an ultraviolet ray on the low dielectric constant insulation film after the plasma is radiated.

In the present invention, the surface roughness of the low dielectric constant insulation film is increased by radiating plasma and, in the same time, the adhesion between the insulation films can be improved more with a synergetic effect obtained from oxidation of the surface of the film caused by radiating an ultraviolet ray and radiating plasma. Here, with oxidation realized by radiating an ultraviolet ray, wettability on the surface of insulation film improves, in other words, the surface becomes hydrophilic and the adhesion can be improved. In addition, remote plasma is preferred when performing radiation with the plasma.

A third aspect of the present invention is a film forming method comprising the steps of performing a reforming process on a surface of an organic insulation film formed on a substrate and forming a film which includes an inorganic film and a Methyl-silsesquioxane film (MSQ film) as at least one of an etching mask and a Chemical Mechanical Polishing stopper (CMP stopper) on the surface of the reformed organic insulation film.

In the present invention, the reforming process is, for example, performed with radiating the ultraviolet ray. An adhesion with the organic film and an inorganic film, a MSQ film and a like formed on the organic film as an etching stopper and CMP stopper is improved with oxidizing the organic film so that the film becomes hydrophilic. Since the organic film does not have a polarity caused by OH group, the organic film is polarized to be hydrophilic by performing oxidization. As a result the adhesion can be improved. In addition, the surface reforming can also be performed with radiating plasma generated from $N_2H_2$ gas, so that the adhesion of an upper layer insulation film and a lower layer insulation film can be improved.

A first aspect of the present invention is a film forming apparatus comprising a coating portion coating an insulation film on a substrate, a reforming process portion reforming a surface of a coated insulation film and a transferring portion transferring the substrate between the coating portion and the reforming process portion.

In the present invention, since the transferring portion transfers the substrate between the coating portion coating the insulation film on the substrate and the reforming process portion reforming the surface of the insulation film, when a processing portion, for example, a heating portion is provided next to these coating portion, reforming process portion and transferring portion, processes like the coating process and the heating process and the like can be performed in sequence with the surface reforming process. As a result, through-put is improved.

A second aspect of the present invention is a film forming apparatus comprising a plasma radiating portion radiating a plasma on a surface of an insulation film and an ultraviolet ray radiating portion radiating an ultraviolet ray on the surface of the insulation film wherein the plasma radiating portion and the ultra violet radiating portion are integrated together structurally.

In such a structure, the surface reforming process performed with both radiating plasma and ultraviolet ray can be completed in one unit, leading to effective improvement in adhesion between the insulation films, in the same time, reduction in space and improvement in through-put.

A third aspect of the present invention is a film forming apparatus comprising a rotating portion rotating a substrate while holding, a supply portion supplying an insulation film forming material on the substrate while rotating the substrate with the rotating portion and a radiating portion radiating a plasma on the substrate while rotating the substrate with the rotating portion.

In such a structure, the supply portion supplying the insulation film forming material and the radiating portion radiating plasma are provided in the same chamber, which leads to reduction in space.

These objects and still other objects and advantages of the present invention will become apparent upon reading the following specification when taken in conjunction with the accompanying drawings.

BRIEF DESCRIPTION OF THE DRAWINGS

FIG. 9 is an experiment result of Ra value and fluorine density on a surface of an inorganic type inter-layer insulation film, on which a reforming process is performed in a process described as "step 2" in FIG. 7.

FIG. 10 is an experiment result of Ra value of a surface of an organic type inter-layer insulation film on which a reforming process is performed in a process described as "step 8" in FIG. 7.

DETAILED DESCRIPTION OF THE PREFERRED EMBODIMENT

Hereinafter, embodiments of the present invention will be explained with reference to the drawings.

Figure 1:
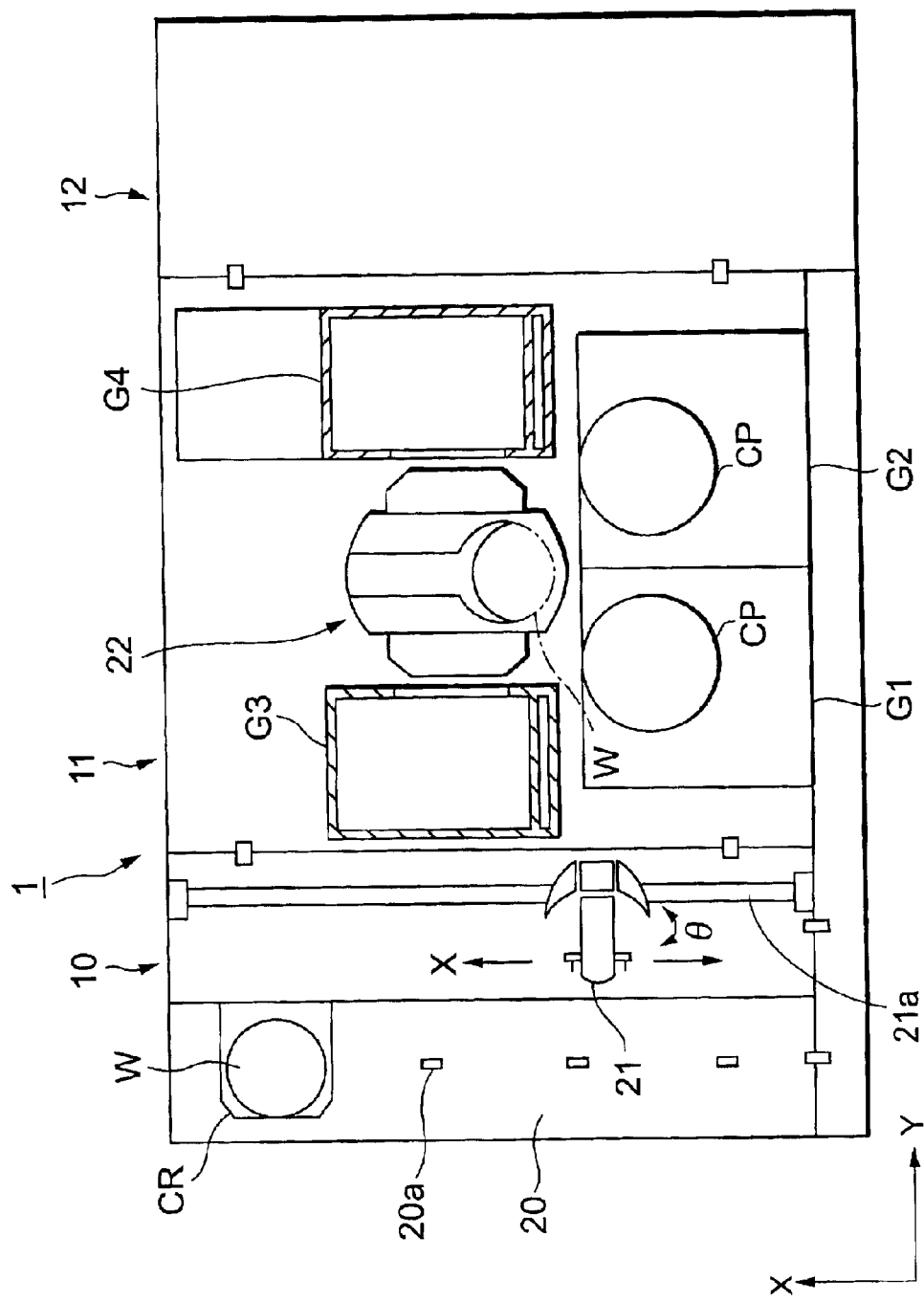
FIG. 1 is a plan view of a Spin on Dielectric system (SOD system) according to a first embodiment of the present invention.
Figure 2:
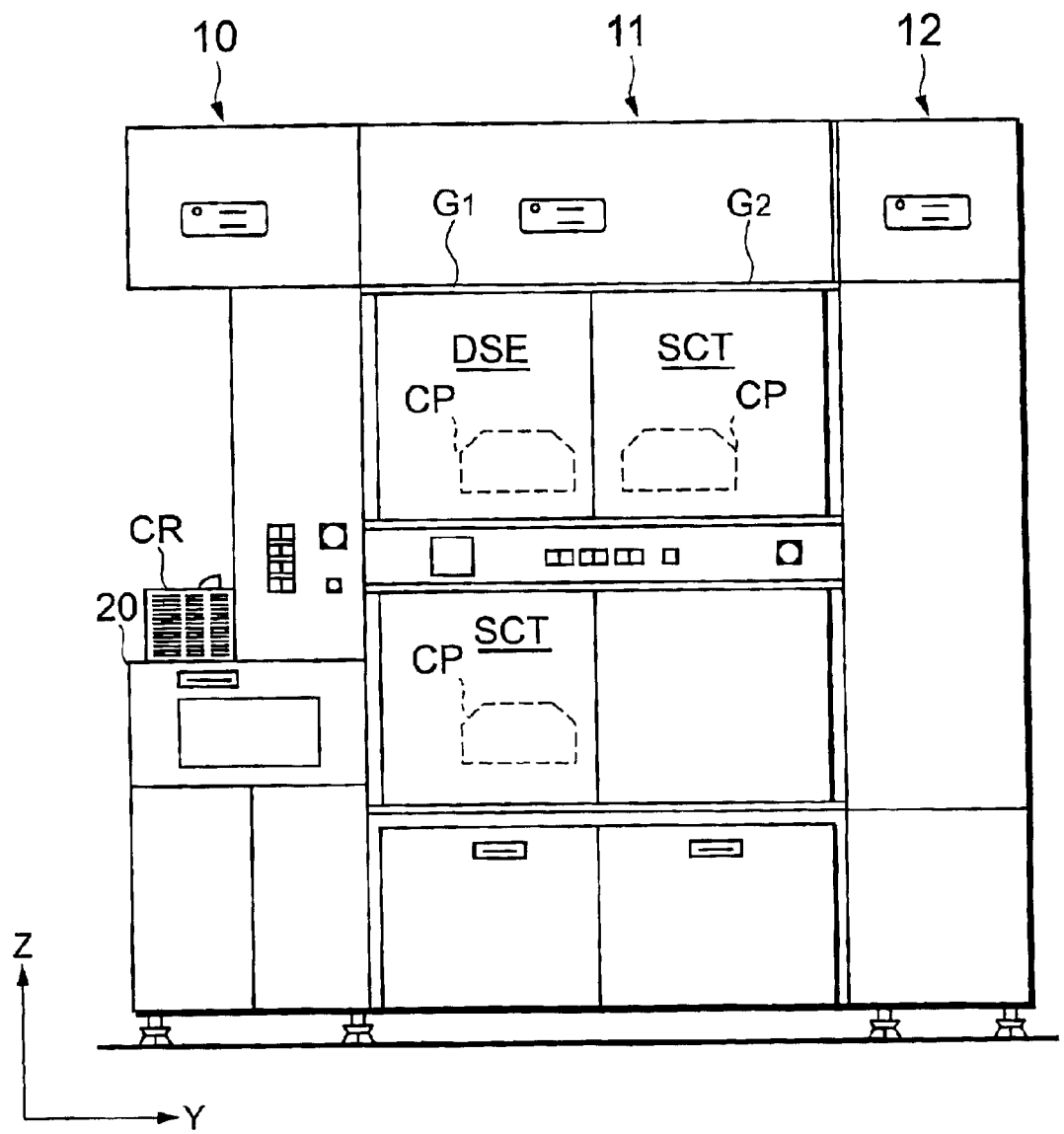
FIG. 2 is a front view of the SOD system shown in FIG. 1.
Figure 3:
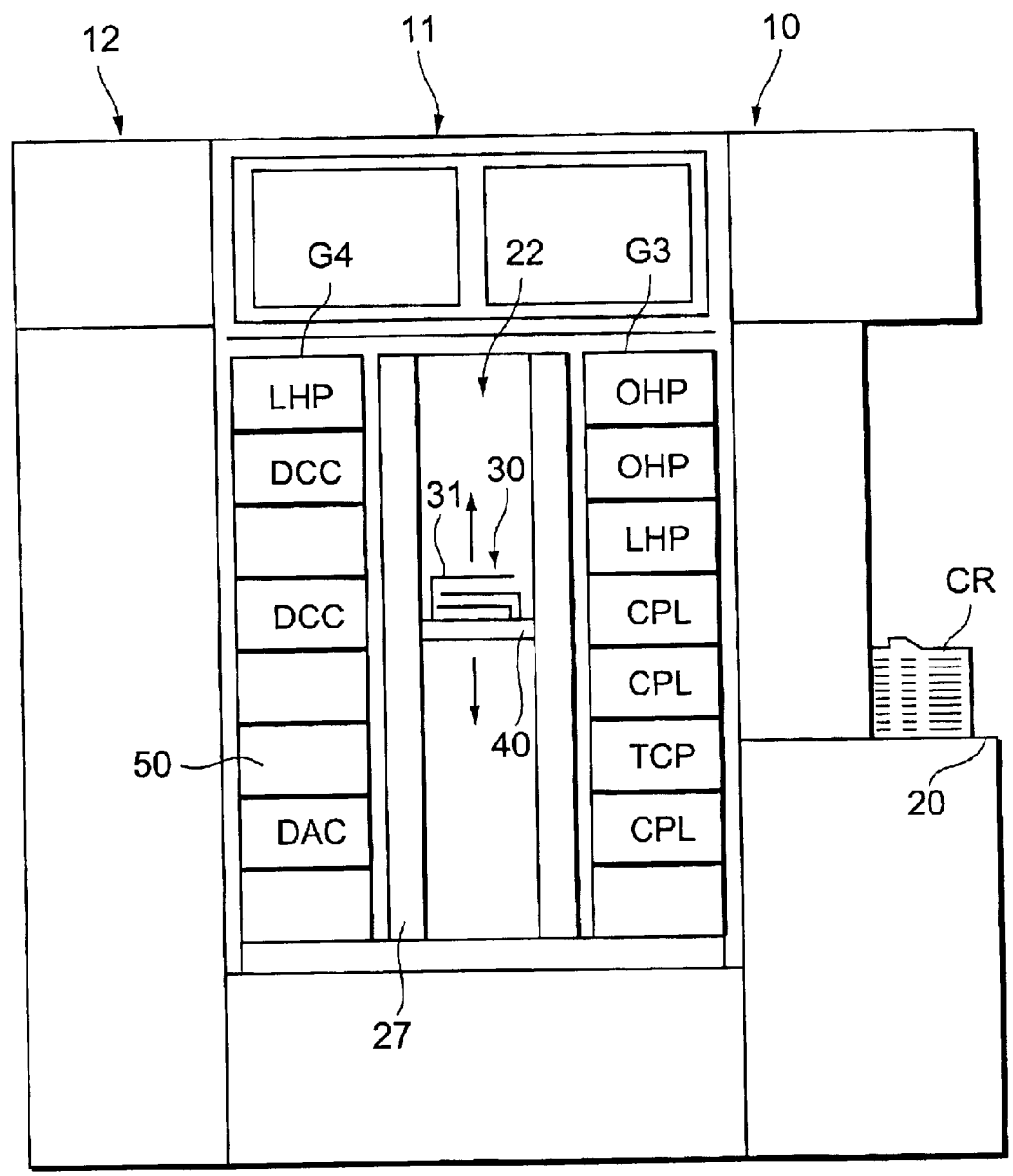
FIG. 3 is a rear view of the SOD system shown in FIG. 1.

FIG. 1, FIG. 2 and FIG. 3 are diagrams showing a total configuration of a Spin on Dielectric system (SOD system) according to an embodiment of the present invention. FIG. 1 is a plan view, FIG. 2 is a front view, and FIG. 3 is a rear view.

The SOD system 1 has a configuration in which, a cassette block 10 for carrying a plurality of semiconductor wafer W (hereinafter referred to as a "wafer"), for example, 25 wafer Ws, as a unit and transferring the wafer Ws into and out of the system and also into and out of the wafer cassette CR, a processing block 11 composed of various kinds of processing units multi-staged at predetermined positions for performing predetermined processing for the wafer Ws one by one in SOD application steps, and a cabinet 12 disposing a bottle of ammonia water, a bubbler, a drain bottle and the like, necessary in an aging step, are structured to be connected integrally.

In the cassette block 10, as shown in FIG. 1, a plurality of, for example, up to four cassettes CR are placed in a line of an X-direction at positions of projections 20a provided for alignment thereof on a cassette mounting table 20, with respective outlet and inlet ports for the wafer W facing the processing block 11. A wafer transfer mechanism 21 movable in the direction of arrangement of the cassettes (an X-direction) and in the direction of arrangement of the wafers housed in the wafer cassette CR (a Z-vertical direction) is structured to be selectively accessible to each of the wafer cassettes CR. Further, the wafer transfer mechanism 21 is structured so that it can be rotated in θ-direction so as to be accessible to transfer and cooling plate (TCP) included in a multi-stage station portion of a third unit group G3 disposed at the processing block 11 side, as will be described later.

In the processing block 11, as shown in FIG. 1, a vertical carrier type of a main wafer transfer mechanism 22 is provided at a center, around which a group of or a plurality of groups of all processing stations are multi-staged. In this example, four processing groups G1, G2, G3, and G4 are disposed multi-staged. The multi-staged stations of the first and the second groups G1 and G2 are disposed on the front side of the system adjacent with each other (the front in FIG. 1). The multi-staged stations of the third group G3 is disposed adjacent to the cassette block 10 and the multi-staged unit of the fourth group G4 is disposed adjacent to the cabinet 12.

As shown in FIG. 2, in the first processing unit group G1, a SOD coating process station (SCT) and a solvent exchanging process station (DSE) are two-staged from the bottom in order. The SOD coating process station (SCT) supplies isolated film material while the wafer W is placed on a spin chuck in a cup CP and applies the isolated film on the wafer uniformly by spinning the water. The solvent exchanging process station (DSE) supplies chemicals for exchange like HMDS and heptane, exchanging a solvent in the coated insulation film with another solvent before the drying step with placing the wafer W onto a spin chuck in the cup CP.

In the second group G2, the SOD coating process station (SCT) is disposed on the upper stage. In addition, the SOD coating process station (SCT), the solvent exchanging process station (DSE) and the like can be disposed on the lower stage of the second group G2 as necessary.

As shown in FIG. 3, within the third group G3, two low oxygen high temperature heating process stations (OHP), a low temperature heating process station (LHP), two cooling process stations (CPL), a transfer and cooling plate (TCP) and a cooling process station (CPL) are multi-staged in sequence from the above. The low temperature heating process station (LHP) has a heating plate on which the wafer is placed and performs the low temperature heating process to the wafer W. The cooling process station (CPL) has a cooling plate on which the wafer W is placed and performs the cooling process to the wafer W. The transfer and cooling plate (TCP) is comprised of two stages, a cooling plate to cool the wafer W on the lower stage and a transferring table on the upper stage where transfer of the wafer W between the cassette block 10 and the processing block 11 takes place.

In the fourth group G4, the low temperature heating process station (LHP), two low oxygen cure and cooling process stations (DCC), an aging process station (DAC) are multi-staged in sequence from the above. The low oxygen cure and cooling process station (DCC) has a heating plate and a cooling plate disposed next to each other in a processing chamber capable of being sealed hermetically and performs a heating process at a high temperature and also a cooling process on the wafer W after the heating process is being performed thereon, all in a low oxygen atmosphere of the oxygen being substituted with nitrogen. The aging process station (DAC) introduces NH3+H2O into the processing chamber capable of being sealed hermetically and performs the aging process on the wafer W, wet-gelling the isolated film material on the wafer W. A surface reforming process station 50 will be described later.

As shown in FIG. 3, a main wafer transfer mechanism 22 has a wafer transfer device 30 that is capable of moving up and down in vertical direction (the Z-direction) inside a cylindrical supporter 27. The cylindrical supporter 27 is connected to a rotating shaft of a motor (not shown) and rotates integrally with the wafer transfer device 30 around the aforesaid rotating shaft by a rotational driving force of the motor. Accordingly, the wafer transfer device 30 can be rotated in θ-direction. A transfer base 40 of the wafer transfer device 30 is provided with, for example, three arms 31. These arms 31 reach the processing stations disposed around the main wafer transfer mechanism 22 and transfer the wafer W between these processing stations.

Figure 4:
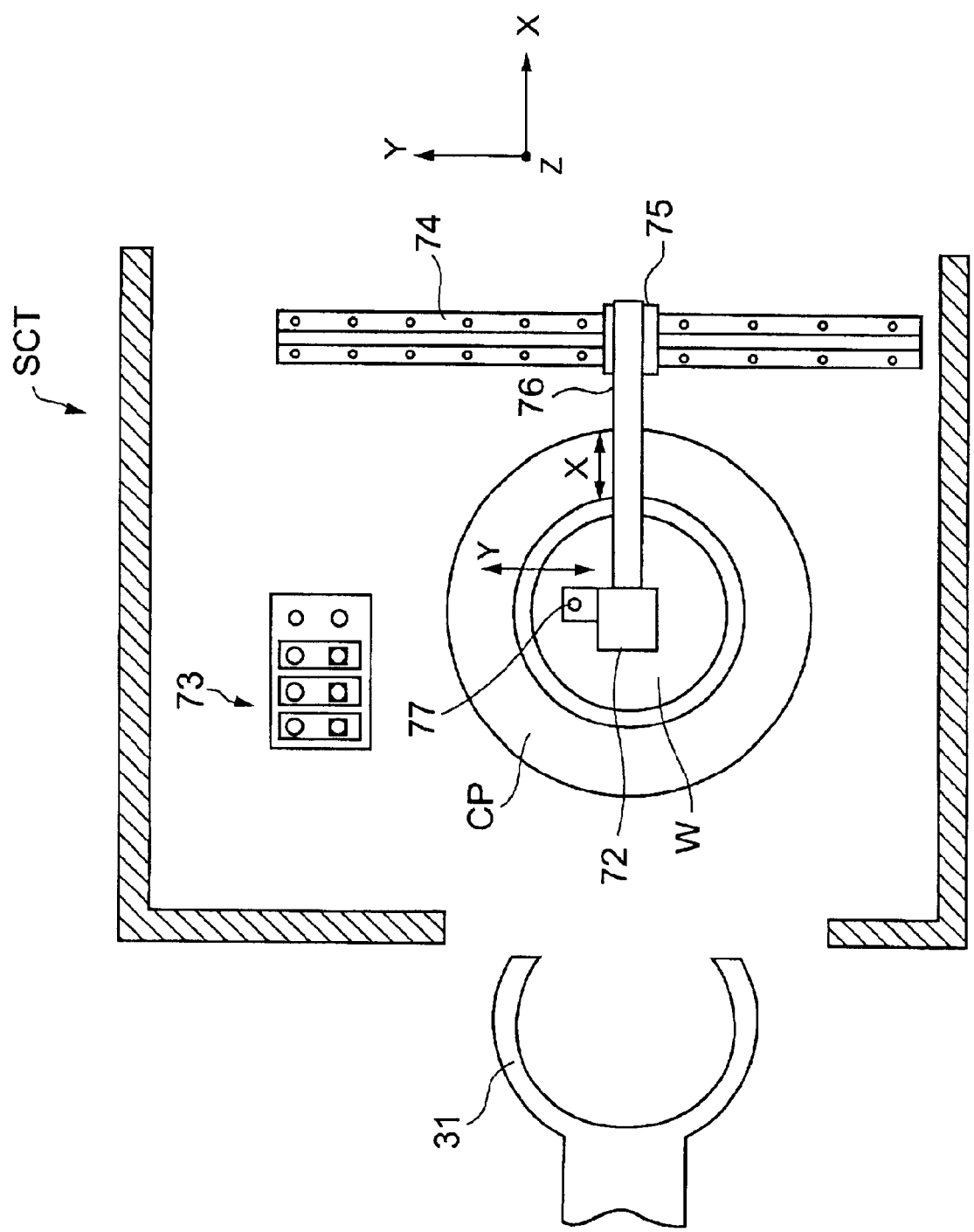
FIG. 4 is a plan view of the SOD coating process station (SCT) according to an embodiment.
Figure 5:
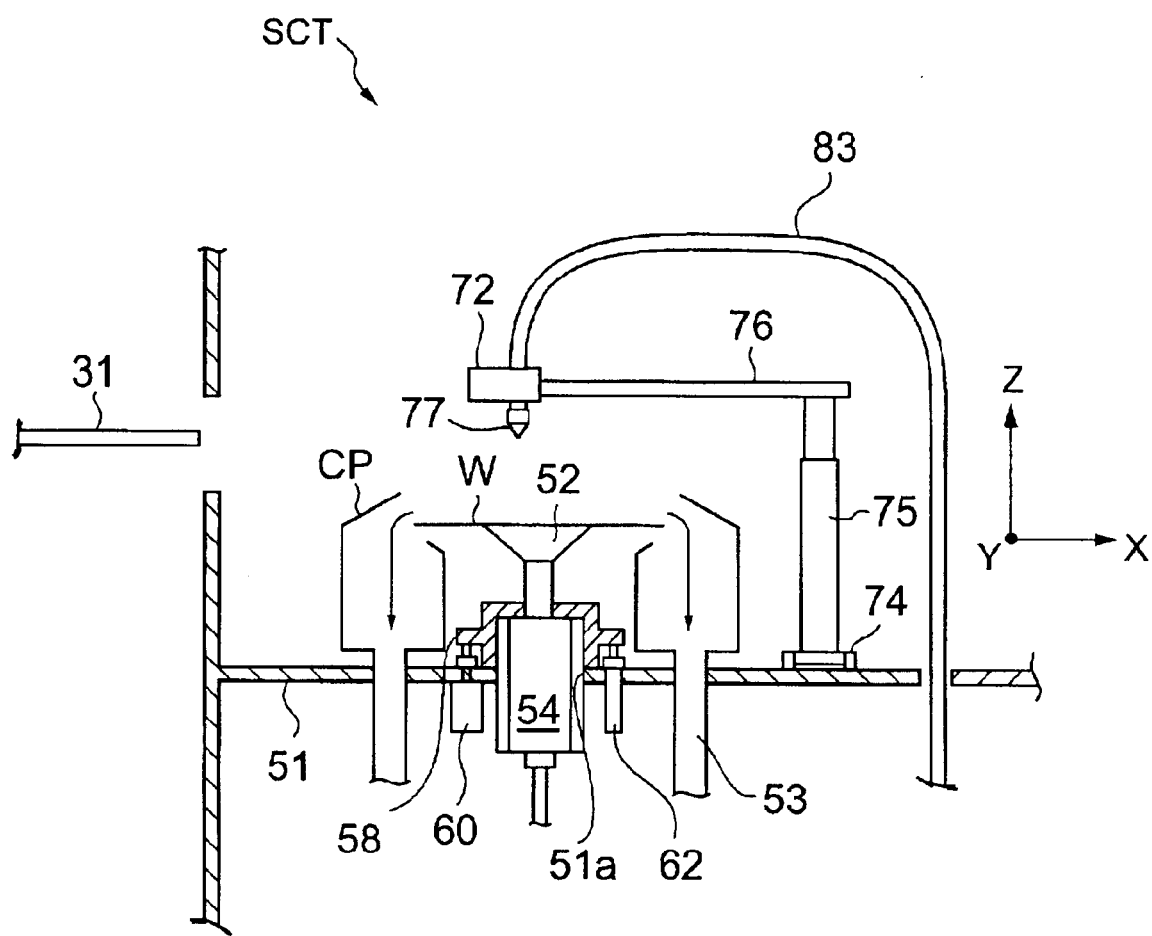
FIG. 5 is a sectional view of the SOD coating process station (SCT) shown in FIG. 4.

FIG. 4 and FIG. 5 are sectional view and a plan view showing a SOD coating process station (SCT). A circular cup CP having a draining pipe 53 is provided at a center of the SOD coating process station (SCT). A spin chuck 52 as a table holding the substrate horizontally is disposed in the cup CP. The spin chuck 52 is rotated with a driving motor 54, while firmly holding the wafer W with vacuum-suction. The driving motor 5, able to move up and down, is disposed at an opening 51a provided in a unit bottom plate 51, and is connected with a raising and lowering mechanism 60 comprising, for example, an air cylinder and a raising and lowering guiding mechanism 62, through a cap-shaped flange member 58 made of, for example, aluminum.

A nozzle 77 discharging an inter-layer insulation film material on the surface of the wafer W is connected to a supply pipe 83 drawn from a supply source of the insulation film material (not shown).

The nozzle 77 is detachably attached to a top of a nozzle scan arm 76 through the nozzle holder 72. The nozzle scan arm 76 is attached to the upper end portion of a vertical support member 75 and can be moved horizontally on a guide rail 74 laid in one direction (the Y-direction) on the unit bottom plate 50 so as to move in the Y-direction integrally with the vertical support member 75 by a Y-direction driving mechanism (not shown).

Figure 6:
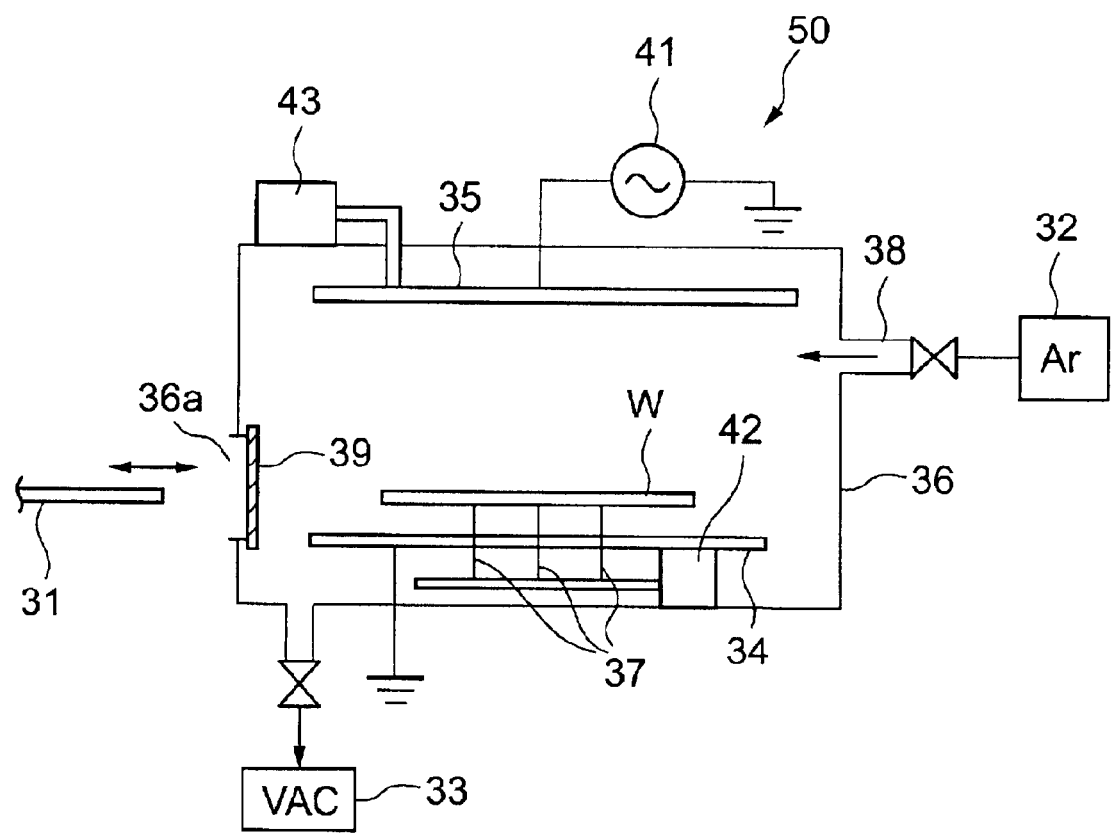
FIG. 6 is a sectional view of a surface reforming process station according to an embodiment.

FIG. 6 is a sectional view showing a surface reforming process station 50 relating to the present invention. In the surface reforming process station 50, a pair of electrode plate 34, 35 are disposed in a chamber 36, high frequency (RF) power source 41 is connected to the upper electrode 35, and the lower electrode 34 is connected to earth. The upper electrode is structured to be able to move up and down with the motor 43, thus a gap with the lower electrode 34 can be changed. The support pin 37 supporting substrate, for example, three of them, capable of moving up and down by the driving motor 42 are disposed on a lower portion of the lower electrode 34. In the chamber 36, a supply port 38 supplying gas from a gas source 32 is provided and a vacuum pump 33 pumping out air inside the chamber 36 is provided on the lower portion of the chamber 36. An opening 36a transferring substrate to the arm 31 of the main wafer transfer mechanism 22 is formed on a side of the chamber 36 and the opening 36a is structured to be able to open and close by a shutter 39. The surface reforming process station 50 is so-called a parallel plate type plasma generating apparatus and surface reforming of the coating film is performed by the plasma.

Next, processing steps of the SOD system 1 structured in above described manner is explained with reference to the FIG. 7 and FIG. 8A to FIG. 8D.

In the cassette block 10, for example, the wafer W on which protective films such as Cu wiring film and SiN are formed in systems like Physical Vapor Deposition (PVD), Chemical Vapor Deposition (CVD) and is transferred from the wafer cassette CR to a transfer table in a transfer and cooling plate (TCP) belonging to the third group G3 of the processing block 11 side with the transfer mechanism 21.

After being transferred to the transfer table in the transfer and cooling plate (TCP), the wafer W is transferred to a cooling process station (CPL) with the main wafer transfer mechanism 22. And in the cooling process station (CPL), the wafer W is cooled to a temperature appropriate for performing processes in the SOD coating process station (SCT) (step 1).

Figure 8A:
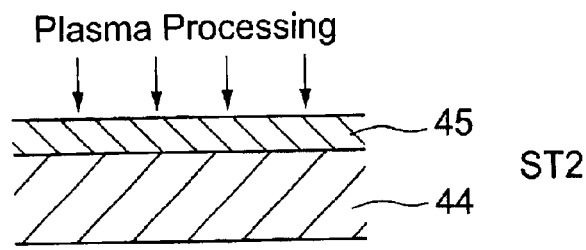
FIG. 8 is a sectional view showing an inter-layer insulation film formed in each processing step illustrated in FIG. 7.
Figure 8B:
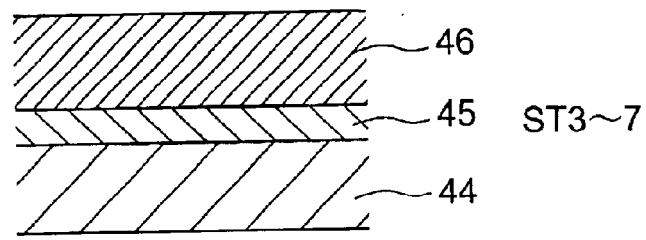

The wafer W on which the cooling process is performed in the cooling process station (CPL) is transferred to the surface reforming process station 50 with the main wafer transfer mechanism 22. At this stage, as shown in FIG. 8A, a SiN film 45 that is an inorganic film accumulated on a Cu film 44 and a hydrophobic process is performed thereon, is subjected to a surface reforming process by Argon plasma (step 2).

The wafer W performed with the reforming process in the surface reforming process station 50 is transferred to the SOD coating process station (SCT) with the main wafer transfer mechanism 22. And in the SOD coating process station (SCT), the nozzle 77 is moved to above the center position of the wafer W with the nozzle scan arm 76 and an insulation film material is supplied. Then the insulation film material is dispersed to the whole surface of the wafer W with the wafer W rotating at high speed (step 3). The coated insulation film material in this case is a low dielectric constant inter-layer insulation film 46 of, for example, $SiO_x(CH3)_y$ and the like, whose compared dielectric constant is, for example, less than 3.0 (referred to FIG. 8B). Other insulation films, such as SILK and Methyl-silsesquioxane (MSQ) are also used. In addition, the inorganic film on which hydrophobic process is performed can be used as well.

After the coating process of inter-layer insulation film is being performed in the SOD coating process station (SCT), the wafer W is transferred to an aging process station (DAC) with the main wafer transfer mechanism 22. Then at the aging process station (DAC), the aging process is performed on the wafer with $NH_3+H_2O$ being introduced into the processing chamber, and the insulation film material on the wafer W is gelled (Step 4).

After the aging process is performed in the aging process station (DAC), the wafer W is transferred to a solvent exchanging process station (DSE) with the main wafer transfer mechanism 22. In the solvent exchanging process station (DSE), the wafer W is supplied with a chemical for exchanging solvents and a process of exchanging the solvent in the insulation film coated on the wafer W with another solvent is performed (Step 5).

After the exchanging process is performed in the solvent exchanging process station (DSE), the wafer W is transferred to a low temperature heating process station (LHP) with the main transfer mechanism 22. And in the low temperature heating process station (LHP), the wafer W is subjected to the low temperature heating process and dehydration process (Step 6).

After the low temperature heating process is performed in the low temperature heating process station (LHP), the wafer W is transferred to the low oxygen cure and cooling process station (DCC) with the main wafer transfer mechanism 22.

Then the wafer W is subjected to a thermal hardening process (a curing process) and the cooling process in an atmosphere of low oxygen in the low oxygen cure and cooling process station (DCC) (Step 7).

Figure 8C:
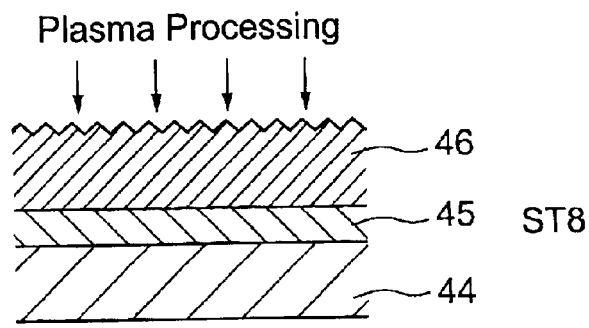

The wafer W processed in the low oxygen cure and cooling process station (DCC) is transferred to the surface reforming process station 50, and as shown in FIG. 8C, the low dielectric constant inter-layer insulation film 46 is subjected to a surface reforming process with Argon plasma (step 8).

Then the wafer W is transferred to the cooling process station (CPL) with the main wafer transfer mechanism 22. And in the cooling plate (TCP), a cooling process is performed on the wafer W (step 9).

Figure 8D:
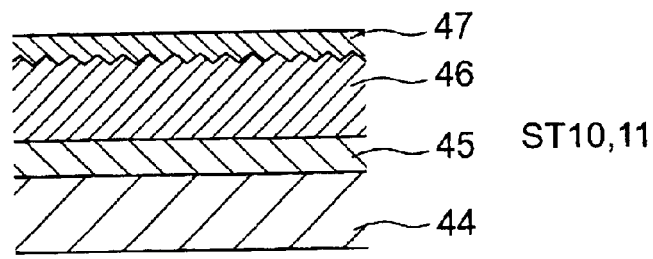

After that an insulation film 47 as an etching mask or a Chemical Mechanical Polishing stopper (CMP stopper) is formed on a surface of the low dielectric constant inter-layer insulation film 46 (step 10) (referred to FIG. 8D).

And the wafer W is transferred to the transfer and cooling plate (TCP) with the main wafer transfer mechanism 22 and the wafer W is subjected to a cooling process (step 11), then, the wafer is transferred to the wafer cassette CR through the wafer transfer mechanism 21 at the cassette block 10.

Now an experiment result of a plasma processing related to the present invention is described. The measurement result of a surface roughness (Ra) of an inorganic type SiOF film and a surface density of fluorine (atomic %) when the plasma processing is performed and not performed, for instance, is shown in FIG. 9.

The processing condition of the plasma processing is as follows;

RF (13.56 MHz) power 2000 W

Type of gas used Argon

Gap between the electrode plates 5 mm

In addition, a surface roughness "Ra" is measured by atomic force microscope (AFM), and the fluorine density (F density) is measured with an X-ray photoelectron spectroscopy (XPS).

The value of Ra is 1.387 Å and F density is 5.6% when plasma processing is not performed, and a peeling occurred on an organic methyl type inter-layer insulation film coated thereafter. In comparison, Ra is 1.037 Å and F density is 2.4% when plasma is radiated for 20 seconds, Ra is 0.989 Å and F density is 2.1% when plasma is radiated for 40 seconds, no peeling occurred on an organic methyl type inter-layer insulation film coated thereafter. From this experiment, the longer the plasma is radiated on the inorganic type film, although the surface of the film became flatter, the adhesion of the inorganic type insulation film and the organic type insulation film had improved as the F density is reduced.

FIG. 10 shows measurement result of the surface roughness (Ra) of the organic type inter-layer insulation film when the plasma processing is not performed and when the plasma processing is performed.

The processing condition is as follows:

RF (13.56 MHz) power 4200 W

Type of gas used Argon gas

Pressure 6600 Pa

Gap between the electrode plates 1 mm

In addition, surface roughness Ra is measured by atomic force microscope (AFM).

The value of Ra is 3.214 Å when plasma processing is not performed, and a peeling occurred on an inorganic type insulation $SiO_2$ film coated thereafter when a tape stripping test is performed. In comparison, Ra is 4.840 Å when plasma is radiated for 20 seconds, Ra is 10.69 Å when plasma is radiated for 40 seconds, and no peeling occurred on an inorganic methyl type inter-layer insulation $SiO_2$ film coated thereafter. From this experiment, the longer the plasma is radiated on the surface of an organic type insulation film, the more the value of Ra is increased. In other words the upper layer is hooked with a plurality of overhangs formed on the surface thus adhesion with a film coated as an upper layer is improved by so-called an "anchor effect" (anchoring effect).

As described above, the adhesion of the inter-layer insulation film formed as an upper layer of SiOF film can be improved with performing plasma processing on an inorganic type inter-layer insulation film, especially on a SiOF that is used to achieve low dielectric constant, as the fluorine density on the surface of the film decreases. In addition, by performing plasma processing on the organic type inter-layer insulation film, adhesion with the inter-layer insulation film formed as the upper layer is improved with the anchor effect.

Furthermore, according to the present embodiment, space necessary for processing substrates can be reduced with providing a surface reforming process station in the SOD system that applies an inter-layer insulation film material to perform heating and curing process. Moreover, the throughput in the SOD system can be improved.

In addition, in the present embodiment, since the hydrophilic structure can be obtained by radiating the ultraviolet ray on the insulation film to oxidize the film surface, the adhesion with the insulation film formed as the upper layer can be improved.

Figure 11:
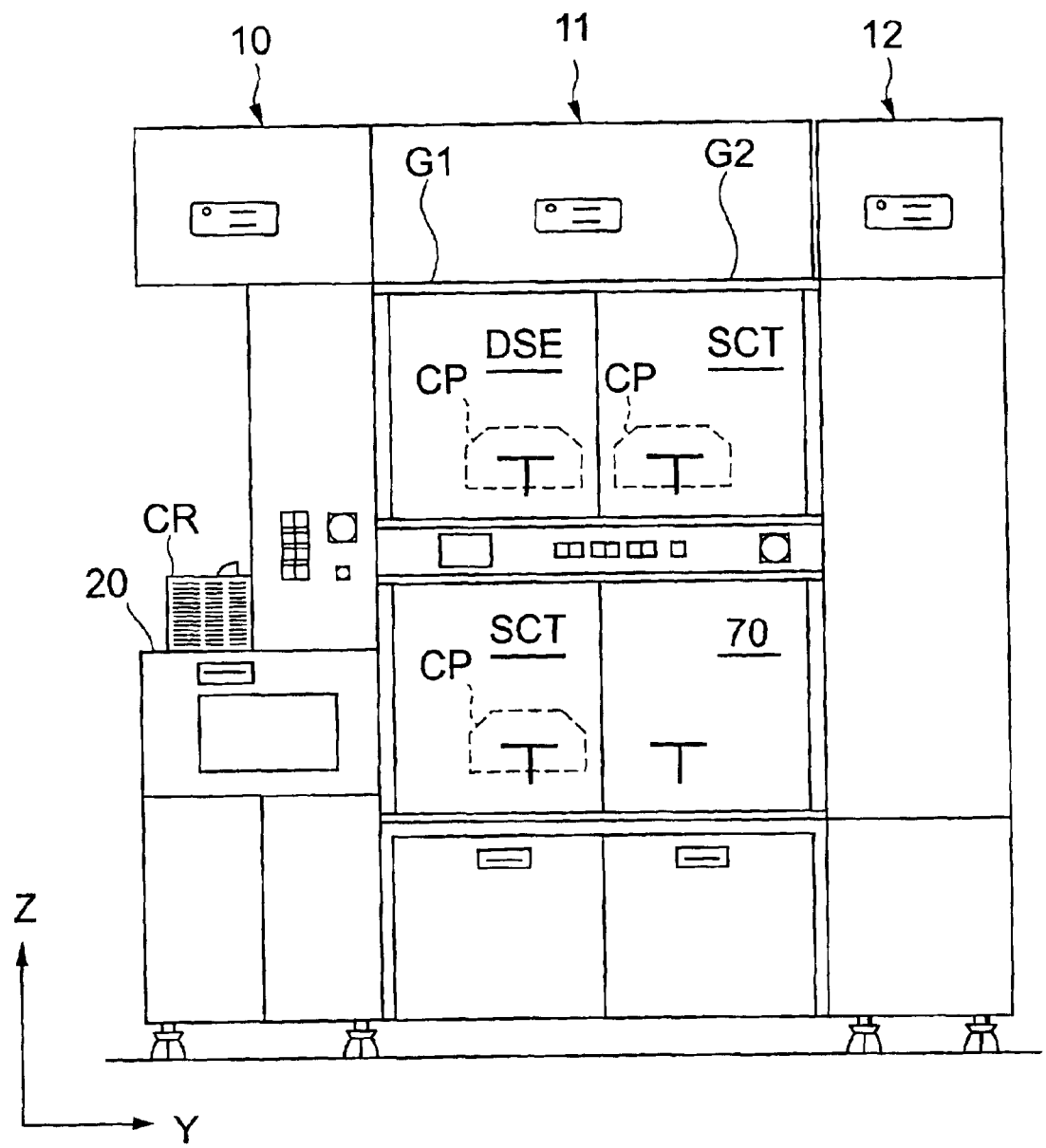
FIG. 11 is a front view of the SOD system according to a second embodiment of the present invention.
Figure 12:
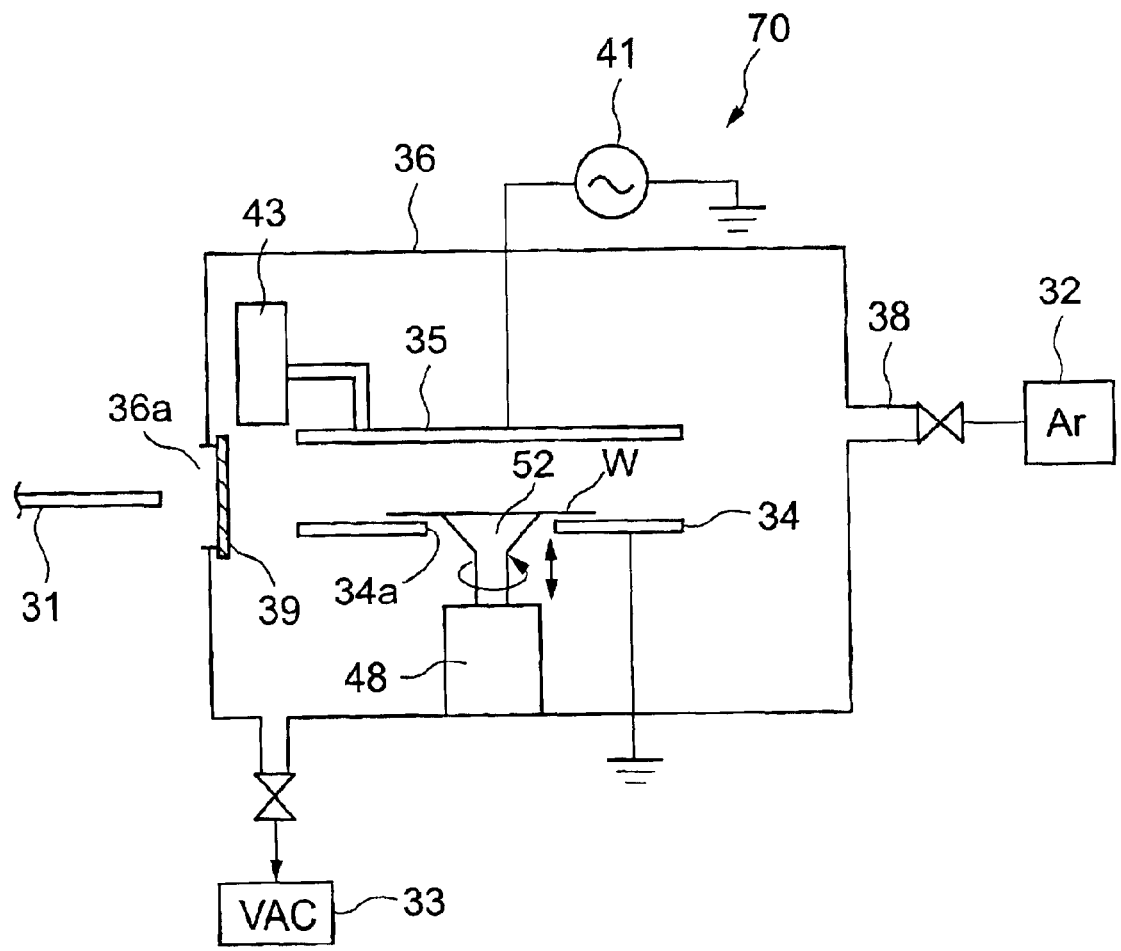
FIG. 12 is a sectional view of a surface reforming process station shown in FIG. 11.

FIG. 11 is a front view showing a SOD system according to a second embodiment of the present invention. FIG. 11 is a plan view of a SOD system according to a second embodiment of the present invention. In the second embodiment, a surface reforming process station 70 performing a reforming process on a surface of the inter-layer insulation film is provided on the lower layer of the second processing group G2 which is a processing station performing coating process. FIG. 12 is a sectional view of the surface reforming process station 70. Same symbols as in the first embodiment are used for the same structure corresponding to FIG. 11 and FIG. 12.

A pair of electrode plate 34, 35 are disposed in the chamber 36, high frequency (RF) power source 41 is connected to the upper electrode 35, and the lower electrode 34 is connected to earth. The upper electrode is structured to be able to move up and down with the motor 43, thus a gap with the lower electrode 34 can be changed. A driving motor 48 rotating the substrate with a motor mechanism and moving the spin-chuck 52 holding the wafer W up and down with a cylinder mechanism is disposed on a lower portion of the lower electrode 34. An opening 34a is provided in the lower electrode 34, and the spin-chuck 52 is able to protrude and sink from the opening. A supply port 38 supplying Argon gas from a gas source 32 is provided in the chamber 36. A vacuum pump 33 pumping out air inside the chamber 36 is provided on the lower portion of the chamber 36. An opening 36a transferring the substrate to the arm 31 of the main wafer transfer mechanism 22 is formed on a side of the chamber 36 and the opening 36a is structured to be able to open and close by a shutter 39.

In the surface reforming process station 70 of a structure as described above, plasma is radiated on the wafer W as the wafer is being rotated. With this configuration plasma is uniformly dispersed on the surface of the wafer W.

In addition, in the present invention, radiation may be performed not only in a reduced pressure state but also under a normal pressure. With this configuration, a processing cost can be reduced.

Figure 7:
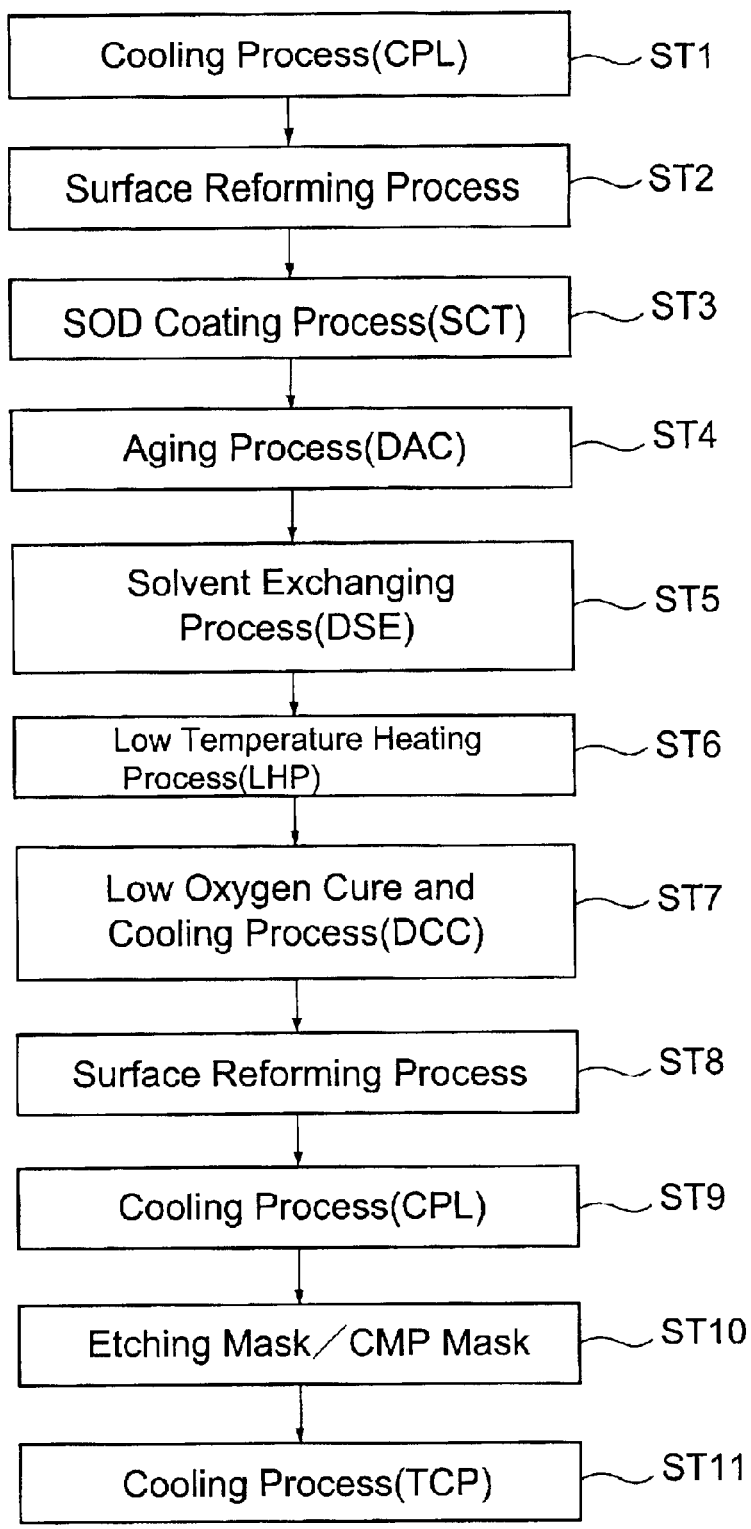
FIG. 7 is a flow chart showing a processing flow of the SOD system illustrated in FIG. 1.

In addition, as a flow chart showing a processing flow in the second embodiment, the surface reforming process in the surface reforming process station 70 is applied in step 2 and step 8 shown in FIG. 7.

Figure 13:
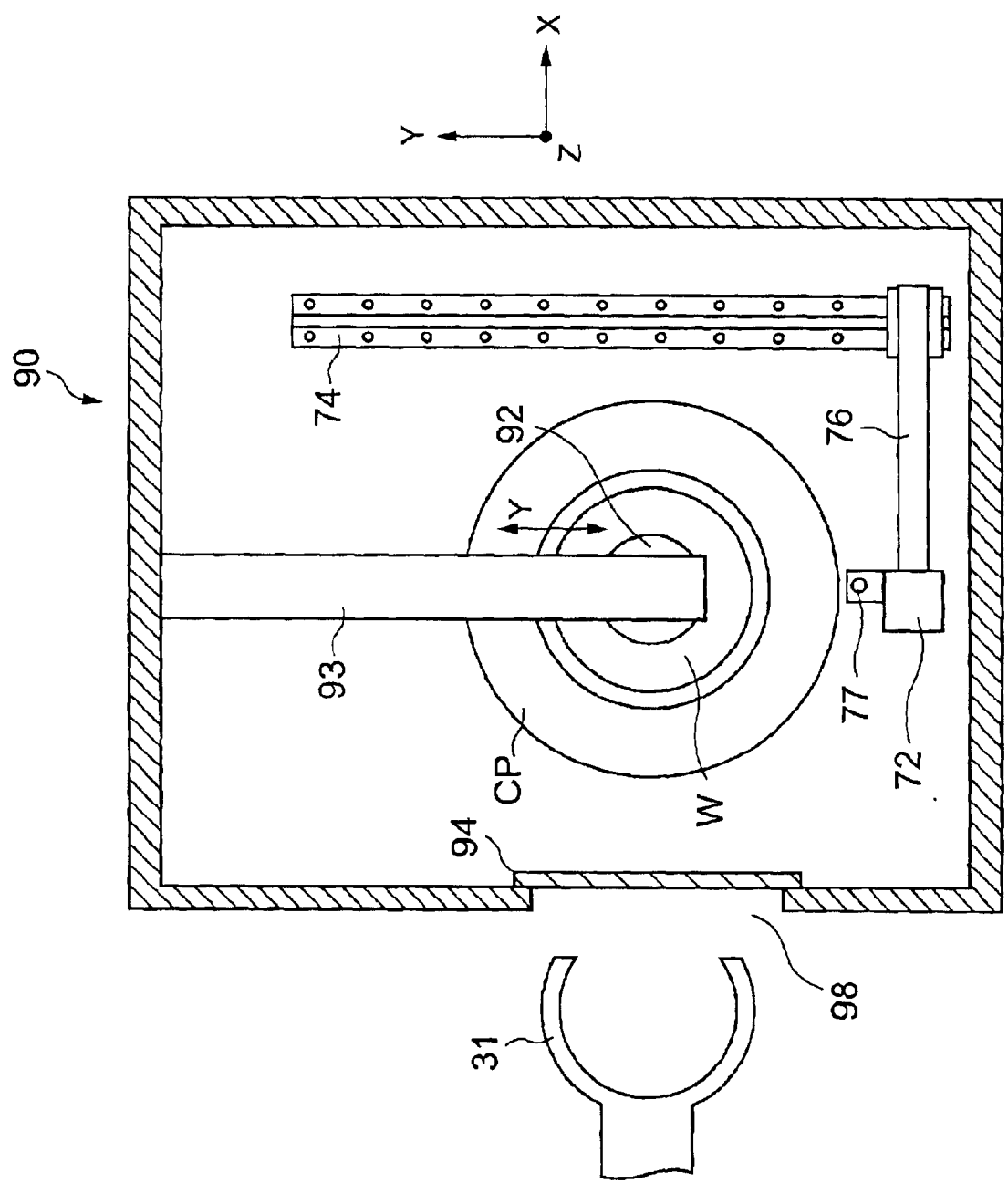
FIG. 13 is a plan view of the surface reforming process station according to another embodiment.
Figure 14:
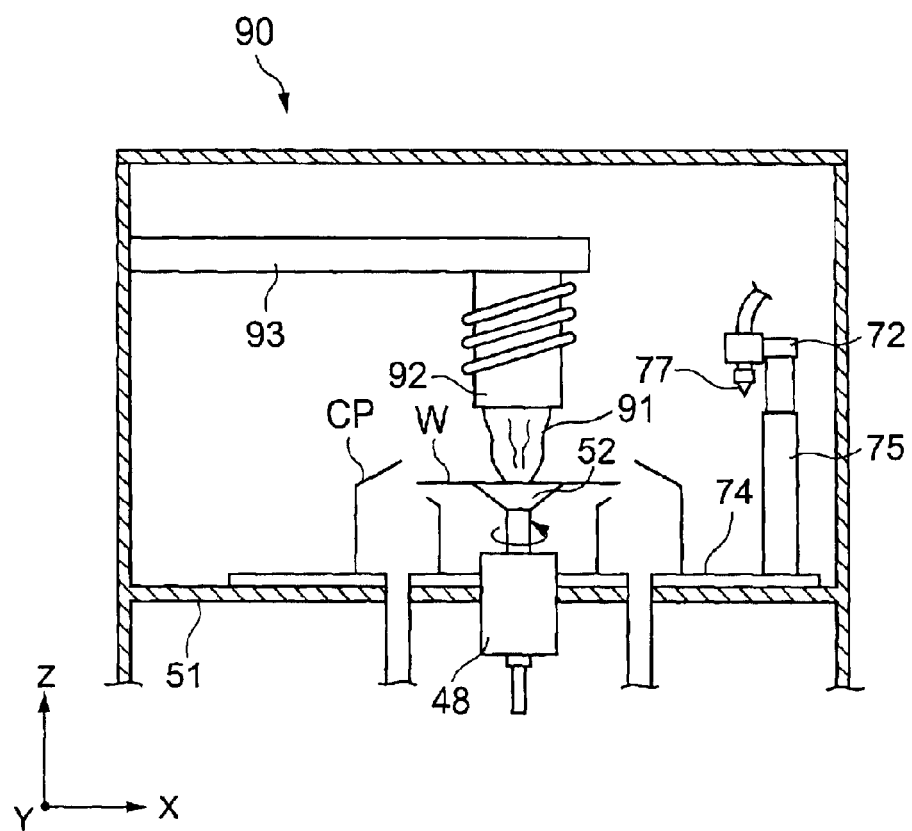
FIG. 14 is a sectional view of the surface reforming process station shown in FIG. 13.
Figure 15:
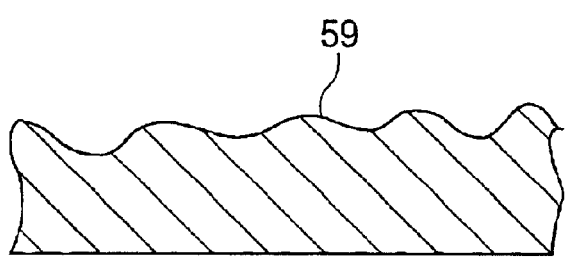
FIG. 15 is a sectional view of an inter-layer insulation film on which the reforming process is performed at the surface reforming process station shown in FIG. 13 and FIG. 14.

FIG. 13 and FIG. 14 are a plan view and a sectional view respectively of the surface reforming process station 50 according to another embodiment. Same symbols as in FIG. 4, FIG. 5 and FIG. 12 are used for the same structure corresponding to FIG. 13 and FIG. 14 and an explanation thereof is omitted.

In the surface reforming process station 90 of the present embodiment, a high-density plasma generating apparatus 92 is provided to be able to move along a guide rail 93 in Y-direction. The high-density plasma generating apparatus 92 is a high-density plasma generating apparatus using, for example, ICP (Inductively Coupled Plasma). And a shutter 94 is provided at an opening 98 that is used for transferring the wafer W to and from the arm 31, capable of hermetically sealing the inside.

The surface reforming process is performed again in the surface reforming process station 90 after coating the inter-layer insulation film in the surface reforming process station 90 while rotating the wafer W on the spin-chuck 52, and after performing heat processing in the low temperature heat processing station and applying process in the low oxygen cure and cooling process station. In this surface reforming process, a high-density plasma generating apparatus 92 moves along the guide rail to a position above the center of the surface of the wafer W, and radiates torch-shaped plasma to the center of the wafer W while rotating the wafer W with the spin chuck 52.

In this process, plasma can be dispersed uniformly on the surface of the wafer W and when the radiation of the plasma is performed on an organic type insulation film, the surface roughness of the insulation film 59 increases due to the "anchor effect". With this configuration, an adhesion with an inter-layer insulation film that is coated in the next step can be improved. In addition, when plasma is radiated on the SiOF film, the adhesion with the inter-layer insulation film coated in the next step can be improved by decreasing the fluorine density.

With this configuration, an adhesion with an inter-layer insulation film that would be coated in the next step can be improved. In addition, when plasma is. radiated on a SiOF film, the adhesion with the interlayer insulation film that is coated in the next step can be improved by decreasing the fluorine density.

As the surface reforming processing of the present embodiment is performed under normal pressure, cost can be reduced compared with a performance under the reduced pressure.

In addition, the surface reforming process of an insulation film can be performed in a single surface reforming processing station 90 and the processing space can be arranged efficiently.

Figure 16:
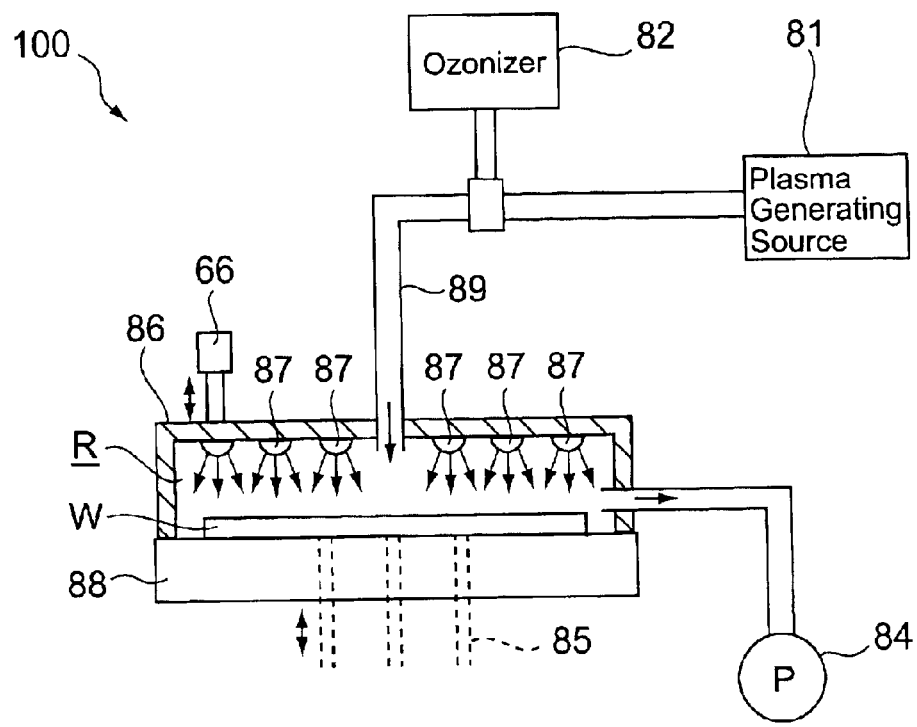
FIG. 16 is a sectional view of a surface reforming process station according to another embodiment.

FIG. 16 is a sectional view of the surface reforming process apparatus relating to another embodiment. In the surface reforming apparatus 100, a lid 86 is placed on a holding table 88 and is structured to be able to move up and down, and a hermetic zone R is formed as the lid 86 moves down. An introducing path 89 introducing plasma from the plasma source 81 into the hermetically sealed zone R is provided in the lid 86 and the surface reforming process apparatus 100 is a plasma generating apparatus of so-called remote plasma type. Argon may be used for generating the plasma, however, N$_2$H$_2$ may also be used. An ozonizer 82 is connected to the introducing path and ozone generated from the ozonizer 82 is introduced in the hermetically sealed zone R. Furthermore, pressure inside the hermetically sealed zone R can be set to several Torrs (several hundred Pa) adjusted by a vacuum pump 84.

The lower portion of the holding table 88 is provided with, for example, three pins 85, that are able to move up and down, and the wafer can be transferred to and from, for example, the transferring mechanism 30.

In addition, a plurality of, for example, ultraviolet lamps 87 are provided inside the lid 86. As an ultraviolet ray radiation, ultraviolet ray of radiation having a wavelength of 172 nm with, for example, an excimer laser is used. Furthermore, an air cylinder 66 to have the lid 86 move up and down is provided with the lid 86 and the lid 86 moves up and down when transferring the wafer W.

In this surface reforming apparatus 100, once the wafer w is placed on the holding table 88, first of all, the surface reforming process of the insulation film formed on the surface of the wafer W is performed by radiating plasma and supplying ozone from the ozonizer. After that, the surface of the insulation film is oxidized further with radiating an ultraviolet ray by the ultraviolet lamp 87. The adhesion between the insulation film and the CMP stopper or the etching stopper that is formed as an upper layer can be improved effectively due to the anchor effect caused by the plasma radiated from the plasma generating source 81 and the oxidation occurred by radiating the ultraviolet ray from the ultraviolet lamp 87 that are integrated together structurally. Here, the wettability of the surface of the insulation film improves with oxidation caused by radiation of the ultraviolet ray when the insulation film is, for example, an organic film like SILK, in other words, the adhesion is especially improved since the surface becomes hydrophilic. In detail, since the organic film does not have a polarity caused with OH group, the organic film is polarized to be hydrophilic with performing oxidization. As a result the adhesion can be improved.

In addition, because the ultraviolet ray has a short wavelength of 172 nm and energy thereof is strong, and organic material in the insulation film can be removed effectively with supply of the ozone from the ozonizer. With this process, the adhesion is improved.

Figure 17:
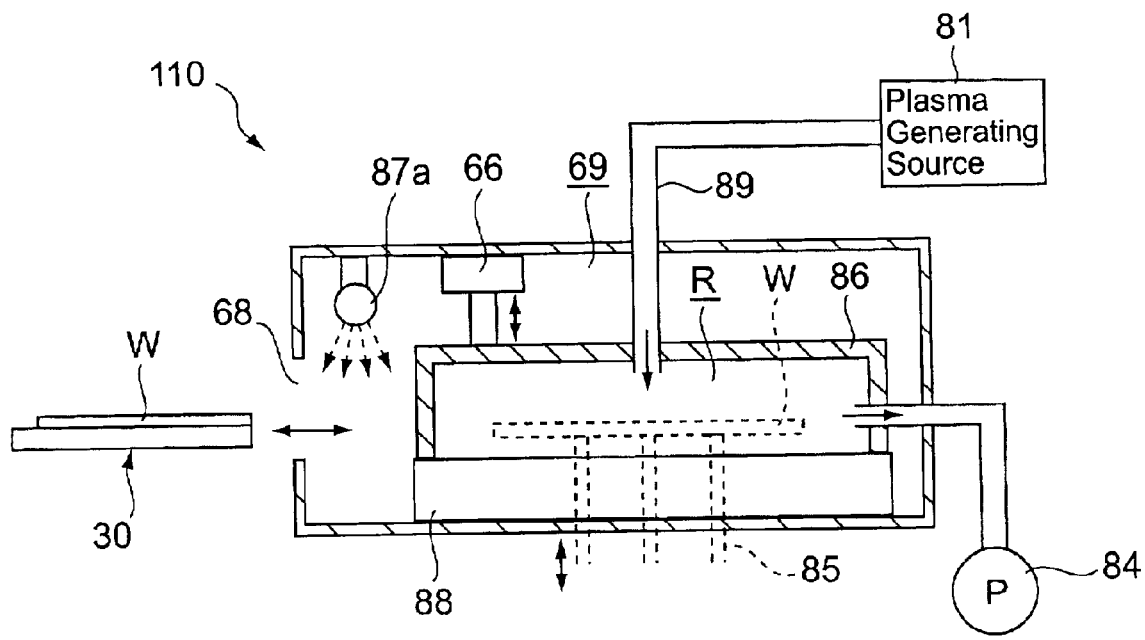
FIG. 17 is a sectional view showing an alternative example of the surface reforming process station illustrated in FIG. 16.

FIG. 17 is an alternative embodiment of the surface reforming process apparatus shown in FIG. 16. A surface reforming process apparatus 100, a similar apparatus as the surface reforming process apparatus 110 is disposed in the processing chamber 69. An opening 68 leading to the processing chamber 69 is provided in the surface reforming process apparatus 110 and the wafer can be transferred, for example, with the wafer transfer mechanism 30 by placing the wafer W thereon. An ultraviolet lamp 87*a* is disposed near the opening 68. The ozonizer 82 is not provided with the surface reforming process apparatus 110, however, it is perfectly acceptable to provide the ozonizer 82 in the introducing path 89 as shown in FIG. 16 in the surface reforming process apparatus 110.

In the surface reforming process apparatus 110 thus constituted, wafer W is placed on the mounting table 88 first, and the surface reforming process of the insulation film is performed with radiating plasma after the hermetically sealed zone R is formed. When the surface reforming process is completed, the lid 86 moves up, the wafer W is taken out from the mounting table 88 with the wafer transfer mechanism 30. As the wafer W is being taken out, ultraviolet ray is radiated to the wafer W with the ultraviolet lamp 87. In this case, the ultraviolet ray is radiated on the whole surface of the wafer W since the wafer W is moved to the left in the diagram.

The same effect as in the surface reforming apparatus 100 can be obtained in the surface reforming apparatus 110 as well as achieving increased through-put and reduction in the number of the ultraviolet lamp 87 with performing the process effectively, since the ultraviolet ray is radiated on the wafer while being transferred.

Figure 18:
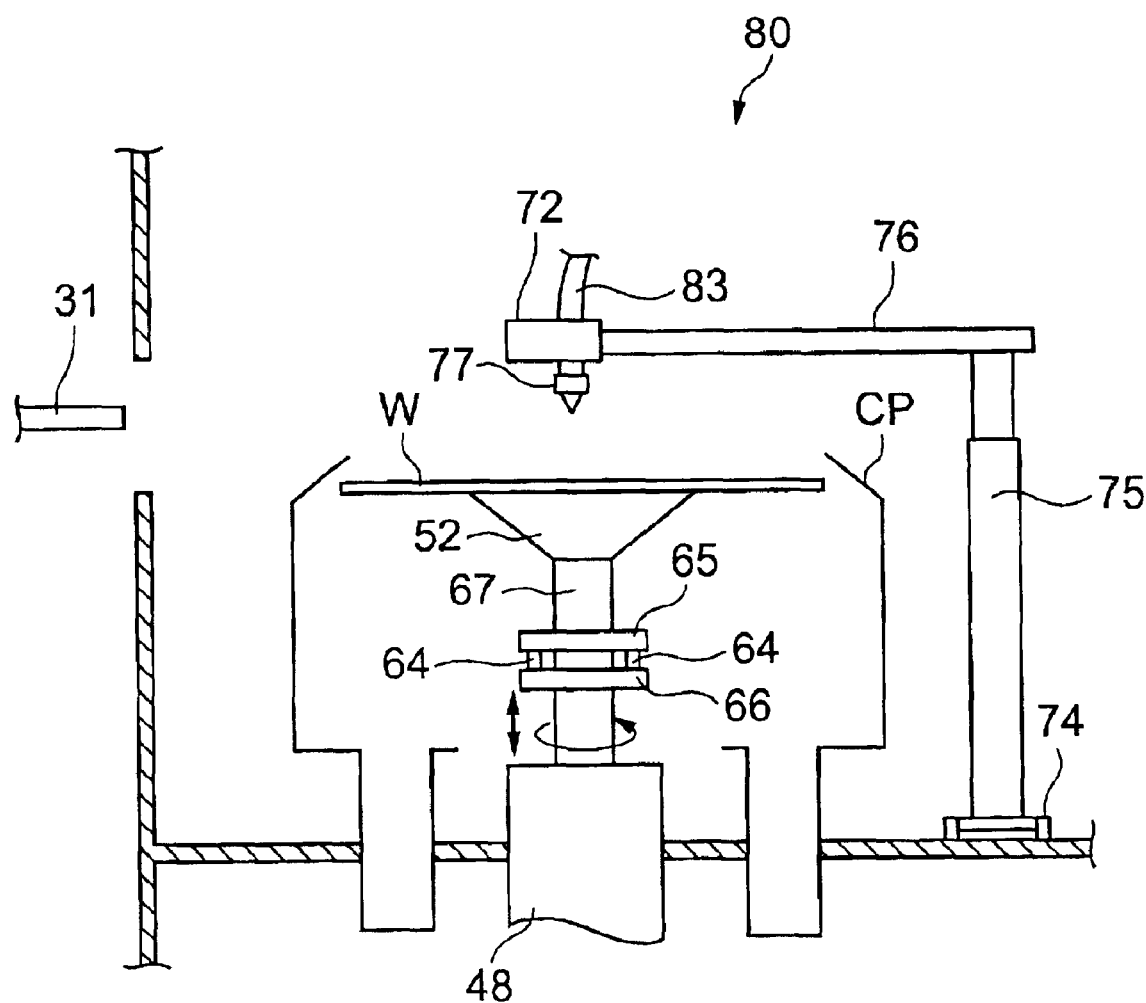
FIG. 18 is a sectional view of the surface reforming process station according to yet another embodiment.

FIG. 18 is a sectional view of the surface reforming process apparatus relating to yet another embodiment. In the present embodiment, the surface reforming process station 80 has the spin chuck 52 holding the wafer W in the cup CP. The spin chuck 52 can be moved up and down and can be rotated by the driving motor 48. Two flanges 65 and 66 are disposed at a rod 67 of the spin chuck in a vertical direction, top and bottom, placing an ultrasonic vibrator 64 inbetween. The ultrasonic vibrator 64 may be provided more than one. The ultrasonic vibrator 64 is structured to vibrate ultrasonically to Z direction. Minute vibration in Z direction caused by the ultrasonic wave is transmitted to the wafer W through the flanges 65 and 66, the rod 67, and the spin chuck 52.

In addition, the nozzle 77 supplying organic type and inorganic type inter-layer insulation film materials on the wafer W is provided in the surface reforming process station 80. Because the supplying mechanism has the same structure as the supplying mechanism of inter-layer insulation film materials in the SOD coating process station (SCT) as described above, the explanation thereof is omitted.

In such structure, for example, after the interlayer insulation film is coated while the wafer W is rotated in the surface reforming process station 80, and heating process is performed in the low temperature heat processing station (LHP), and being processed in the low oxygen cure and cooling process station (DCC) the surface reforming process is performed for the second time. This surface reforming process increases the surface roughness of the insulation film by the ultrasonic vibration of the ultrasonic vibrator 64 that is transmitted to the inter-layer insulation film formed on the wafer W with the anchor effect. With this configuration, adhesion of the inter-layer insulation film coated in the next step can be increased.

The surface reforming process of an insulation film can be performed in a single surface reforming processing station 90 and the processing space can be arranged efficiently.

The present invention is not limited to an embodiment as described above, however, various kinds of modification is possible.

SiOF, SiO$_x$ (CH3)$_y$ and the like are used as the inter-layer insulation film in each embodiment described above, however, the present invention can be applied to other insulation films as long as a low dielectric constant (dielectric constant of less than 3.0) is obtained.

The reforming process by the surface reforming process station 50 of parallel plate type in the first embodiment mentioned above is performed under reduced pressure state, however, the process can also be performed under normal pressure.

Furthermore, each of the embodiments described above is not limited to the application to a semi-conductor wafer processing system, however, the present invention can also be applied to a system processing a glass substrate used with liquid crystal display and the like.

As described above, according to the present invention, regardless of an organic type and inorganic type insulation film, an inorganic film on which the hydrophobic process is being performed, a SiOF film etc. adhesion between the films and also between the interlayer insulation film and other neighboring film can be improved.

The disclosure of Japanese Patent Application No.2001-070947 filed Mar. 13, 2001 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A film forming method, comprising the steps of:

performing a reforming process by radiating a plasma on a surface of a low dielectric constant insulation film formed on a substrate including one of a porous low dielectric constant insulation film and a non-porous low dielectric constant insulation film so that a density of a fluorine on the surface of the low dielectric constant film decreases; the low dielectric constant insulation film being an inorganic film on which a hydrophobic process is performed; and forming an insulation film as at least one of an etching mask and a Chemical Mechanical Polishing stopper on the reformed surface of the low dielectric constant insulation film.

2. The film forming method, as set forth in claim 1, wherein the plasma is radiated in a parallel plate type plasma generating apparatus.

3. The film forming method, as set forth in claim 1, wherein the plasma is radiated in an Inductively Coupled Plasma.

4. The film forming method, as set forth in claim 1, wherein the plasma is radiated while the substrate is rotated.

5. The film forming method, as set forth in claim 1, wherein the plasma is radiated under a normal pressure.

6. The film forming method, as set forth in claim 1, wherein the reforming process is performed with applying an ultrasonic vibration to the substrate.

7. The film forming method, as set forth in claim 1, wherein the plasma processing is performed for at least 20 seconds.

8. A film forming method comprising the steps of:

(a) performing a reforming process on a surface of an organic insulation film formed on a substrate by radiating a plasma generated from $N_2H_2$ gas;

(b) oxidizing the surface of the organic insulation film by radiating an ultraviolet ray; and (c) forming a film which includes an inorganic film and a Methyl-silsesquioxane film as at least one of an etching mask and a Chemical Mechanical Polishing stopper on the surface of the reformed organic insulation film.

9. A film forming method comprising the steps of:

performing a reforming process by radiating a plasma on a surface of a low dielectric constant insulation film formed on a substrate including one of a porous low dielectric constant insulation film and a non-porous low dielectric constant insulation film so that a surface roughness of the low dielectric constant insulation film is increased; the low dielectric constant insulation film being an inorganic film on which a hydrophobic process is performed; and forming an insulation film as at least one of an etching mask and a Chemical Mechanical Polishing stopper on the reformed surface of the low dielectric constant insulation film.

* * * * *